United States Patent [19]

Muscher et al.

[11] Patent Number: 4,770,454
[45] Date of Patent: Sep. 13, 1988

[54] HOLDING DEVICE FOR PICK-UP, TRANSPORT, AND DEPOSIT OF SMALL COMPONENTS

[75] Inventors: Siegfried Muscher; Franz Dankesreiter, both of Grafenau; Franz Dankesreiter, Jr., Neuschonau; Manfred Band, Cadolzburg, all of Fed. Rep. of Germany

[73] Assignee: Wilhelm Sedlbauer GmbH, Fed. Rep. of Germany

[21] Appl. No.: 35,500

[22] Filed: Apr. 7, 1987

[30] Foreign Application Priority Data

Apr. 8, 1986 [DE] Fed. Rep. of Germany ....... 3611789

[51] Int. Cl.⁴ .......................... B25J 15/06; B66C 1/02
[52] U.S. Cl. .................................................. 294/64.1
[58] Field of Search .................. 294/64.1, 64.2, 64.3, 294/65; 414/627, 737, 744 B, 752; 271/90, 91, 103; 269/21; 278/3; 29/743; 248/362, 363

[56] References Cited

U.S. PATENT DOCUMENTS 4,657,470 4/1987 Clarke et al. ..................... 294/64.1
4,674,784 6/1987 Wooley ............................. 294/64.1

Primary Examiner—James B. Marbert
Attorney, Agent, or Firm—Steele, Gould & Fried

[57] ABSTRACT

The invention refers to a holding device consisting of holding head and holding shaft for pick-up, transport, and targeted deposit of small components, namely preferably for supplying circuit boards with electrical SMD switching elements.

According to the invention, the holding head is designed so that upon a pressure in the direction of the components to be picked up, a bistable switching element is activated and consequently, the adhesion of the component as well, and upon the next pressure in the same direction, it is again deactivated. This saves specific control actions to activate and deactivate a compressed air source or other adhesive devices.

8 Claims, 1 Drawing Sheet

HOLDING DEVICE FOR PICK-UP, TRANSPORT, AND DEPOSIT OF SMALL COMPONENTS

BACKGROUND

The present invention refers to a holding device for pick-up, transport and targeted deposit of small components.

There is a particular need for a holding device of this nature for the assembly of circuit boards—conductive boards—when the individual components are removed from a container with a great number of similar components and thereafter must be identified and located in a position and orientation on the board as determined by the wiring, whereafter they will be soldered to their connections.

Thereby, the deposit of various electrical components occurs in accordance with a precisely predetermined program whereby, if necessary, light point indicators or similar aids are provided.

Recently, miniature components, particularly SMD circuit elements, have become known, in the use of which the common manual work method is no longer possible, and which, contrary to earlier electrical components, are no longer provided with actual wire connections that extend from the component and accordingly can easily be soldered. These miniature components generally have end to end contact, and soldering of a component held between the fingers is thus excluded from the very beginning. The use of tweezers is very time-consuming, since the removal of individual components from a container generally does not allow the proper spatial allocation between holder (tweezer) and component.

A number of pick-up grippers or pipettes have already been suggested, which generally consist of a holding head with a holding shaft, whereby the individual components are suctioned up to a suction opening in the holding head via a suction line, transferred in this manner, and deposited on the circuit board.

The devices facilitate a simple pick-up of the individual components and generally also a faultless deposit of the component on a circuit board at the location desired in each case.

In some executions, the source of negative pressure, which is generally connected via a connecting hose through the gripper part to the holding head and its exit opening, is switched on and off by means of a pedal switch. Thereby, movements of hand and feet must be precisely coordinated, and since the deposit of a miniature component onto a circuit board requires extreme concentration, the operator is disturbed by the additional foot movement, which also easily causes a jarring movement, whereby the component might in some cases be dislocated precisely at that moment when it should be deposited, and consequently, it is incorrectly soldered.

Increase and decrease of negative pressure in this type of manual equipment are also too slow for many purposes.

Holding devices for the abovementioned components have also become known, in which the increase and decrease of pressure is initiated via a switch in the handle or an air escape opening which is opened and closed by the operator. This also causes the disadvantage that additional jarring movements may occur due to the activation of a switch in the shaft and render a correct deposit of the small components more difficult.

In addition, it should be noted that the spatial assignments between component and circuit board may require orientations that deviate from one another by as much as 180°. Thereby, the operator must also grasp the holding handle in a different way, or turn the hand, which can make the activation of a switch in the handle extremely difficult.

OBJECTS AND SUMMARY OF THE INVENTION

The object of the invention is to indicate a holding device for small components, i.e. particularly miniaturized small electrical components, whereby pick-up and deposit of the components by the operator require no additional switching actions, but rather occur as a result of the holding device being brought close to the component in a simple manner resp. occur automatically when the component is at the desired deposit point.

In a holding device according to the invention, the holding head, which is to hold the component at its front side and from which the component is then deposited, is executed in two parts, whereby the two parts have a certain telescoping range against a spring force. For this purpose, a bistable switching element is provided, which is and remains switched at every pressure on the tip of the holding head proper, even if the pressure has decreased. In the case of holding the components by means of negative pressure and according to one execution according to the invention, the holding device with the holding head is thus pressed onto a component, whereby the negative pressure is and remains activated via the bistable switching element.

When the component is to be deposited onto the circuit board, the pressure generated at the moment of deposit provides a new impulse, and the bistable switching element deactivates the negative pressure, so that the grip-like holding device can be immediately removed and guided to pick up another component.

The expert will recognize that the bistable switching element to be provided according to the invention can be executed in various manner—generally stated according to the intended purpose. When the invention is used in conjunction with assembly benches where electrical energy is already available for the soldering process, the bistable switching element will consist of an electrical tilting step, which is repeatedly switched via contacts arranged in the holding head in the same manner as in a primary counter, and will be activated and deactivated via a magnet valve or similar negative pressure source.

Other bistable switching elements may also be provided within the concept of the invention, e.g. simple catch springs which snap in one direction at impact and then in the other direction at the next impact and thereby either cover or uncover a suction opening or move a push-off pin or similar part back and forth as will be explained in greater detail in conjunction with an execution example. According to one advantageous execution example of the inention concept, this is particularly advantageous if the individual component is held onto an adhesive lagging or prop to be provided at the tip of the holding head, and if a push-off pin can be moved back and forth through the prop or the lagging, whereby the push-off pin can be activated according to the concept of the invention by means of a mechanical switching element of the type found e.g. in ball point pens, etc.

BRIEF DESCRIPTION OF THE DRAWINGS

The structure of a holding device will be explained in the following, summarily and with reference to the enclosed drawing. The drawings show.

DETAILED DESCRIPTION

Figure 1:
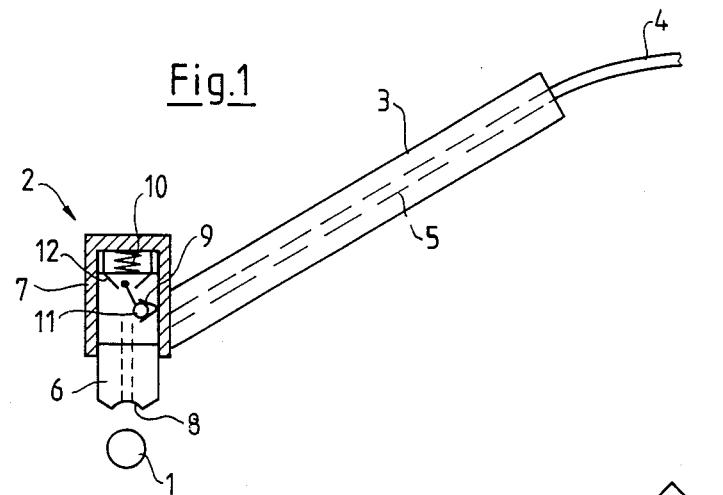
FIG. 1 Basic structure of a holding device according to the invention, in the form of a suction pipette.

With reference to FIG. 1, the invention will be explained again, in context. It is assumed that a cylindrical SMD switching element 1 is to be suctioned in by negative pressure when a holding device approaches which consists of a holding head 2 with holding shaft 3. Thereby, the front part of the holding head 2 is adjusted to the component 1 insofar that the negative pressure generated via the feed line 4 and interior passage 5 in the shaft 3 by a negative pressure generator is fully covered and thus holds the component 1.

According to the invention, the holding head is executed in two parts, whereby the front sliding part 6 with the suction opening 8 can be pushed inwards against the pressure of a spring 10. For this purpose, the rigid part 7, which has a fixed connection with the shaft 3, is designed as a guide.

In the interior of the holding head, a ball valve 9 is indicated, which is enabled by means of a mechanical tilter 11 to assume two different positions whereby, in the position shown on the drawing, the negative pressure will be prevented, while the ball will free the suction opening if the tilter is switched to the left. In order to move this tilt switch 11 back and forth, two control pins have been provided which always trigger the reversal of the tilt switch when the front part is pressed back slightly.

In the represented case, there would now be negative pressure in the line 5 in the holding shaft 3, and the valve ball 9 would be in the represented position, so that no suction noise can be heard at the suction opening 8 and no air can be suctioned in.

If the total device is brought onto the component 1 and a certain pressure is exerted there—which is immediately possible since the component rests either on the bottom of a container or on top of other components—the head 6 is pressed inwards and the control pin 12 to the right would press the tilt switch towards the left, where it remains in a stable position even though the head is again pressed downwards by the counterforce of the spring 10. The ball 9 frees the suction path, and negative pressure is generated at the suction opening 8.

The holding device can then be freely moved with the component 1, and, if the operator then deposits the component 1 onto a circuit board (not shown) and exerts a brief pressure which is necessary for correct placement of the component on the circuit board, the left control pin again moves the tilt switch 11 and the suction opening is closed, so that the total holding device can immediately be released from the component 1, since this is located on the circuit board and soldered there. In this stage, there is no negative pressure at the suction device until the holding device has been placed against the next component.

With reference to FIG. 1, the principle of the invention was initially and purposely explained in a very schematic manner and without design details, since the expert will be familiar with several designs for implementation of the demonstrated function. For this reason, reference is made merely to the multitude of switching devices known in conjunction with ball point pens, which devices, upon application of pressure, force the writing tip out, hold it in a stable extended position and, at the next pressure application, allow the writing tip to snap back again without falling forwards a second time.

Figure 2:
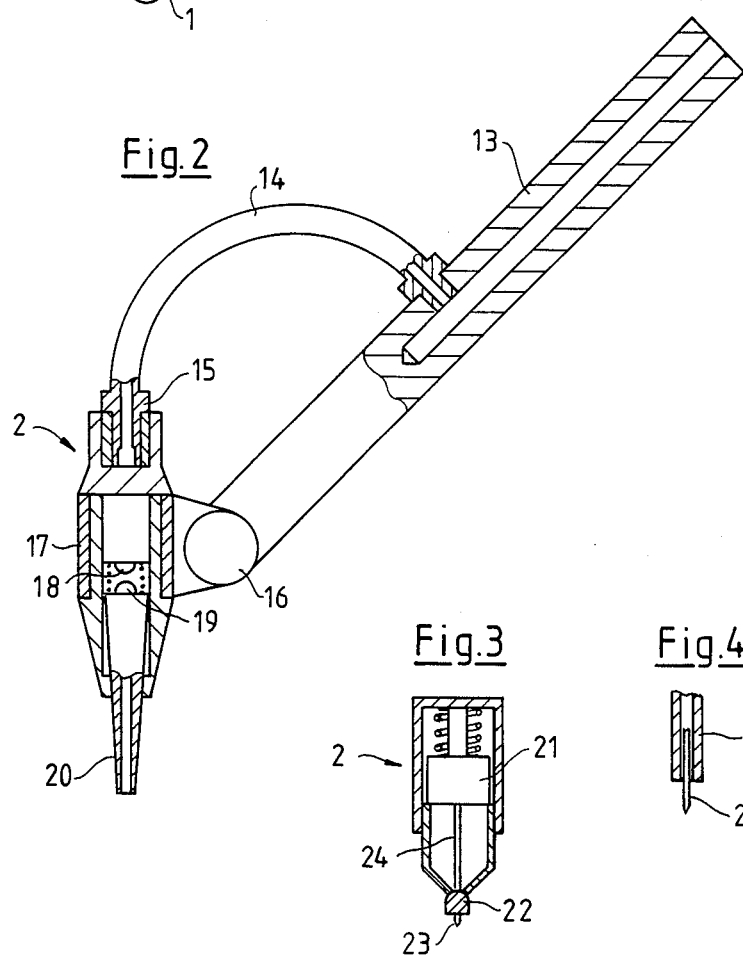
FIG. 2 basic structure of a possible practical execution.

FIG. 2 shows, in a slightly more detailed manner, the structure of a holding device according to the invention, in the form of a suction pipette. In the represented execution, the hose with the negative pressure is led out of the handle 3 and inserted from the top into the holding head 2, which is again executed in two parts. Thereby, the hose 4 can be turned, air-tight, in the upper neck of the holding head 2, in order to allow any desired arrangement of the holding shaft 3 in relation to the holding head 2. For this purpose, a joint 16 has been provided which allows the setting of any desired angle of the holding shaft 3 to the axis of the holding head 2.

This joint 16 is attached to a sleeve 17. The sleeve 17, the axis of which coincides with the center line of the holding head 2, can be freely turned on bearings in the holding head 2, so that consequently, the holding shaft can be rotated around the holding head 2.

In the represented execution, the tip 20 of the suction pipe is shown as being replaceable. In the anticipated execution, the switching element—not shown—is electrically controlled, namely via the electrical contacts 18 and 19, which are pressed away from one another by means of a spring, which is only intimated.

From this representation as well, it can be seen that a light upward pressure on the suction tip 20 of the head 2, e.g. by means of the holding shaft 13, causes the two contacts to touch and generate a current circuit which then correspondingly switches a bistable tilting element which, in turn, triggers the activation and deactivation of the negative pressure.

Figure 3:
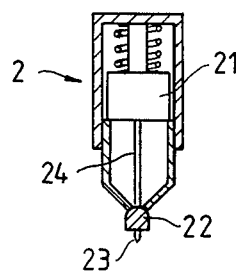
FIG. 3 the use of an adhesive prop in conjunction with a holding head.

With reference to FIG. 3, it will only be intimated in the following that the holding device according to the invention can also be implemented without connection to a suction source. Only the holding head without holding shaft is schematically indicated in FIG. 3, whereby the head is again executed in two parts. Contrary to the two previously described executions, there is a prop of an adhesive material at the tip of the holding head, at which prop a component will adhere with sufficient strength for transport.

In this case, a mechanically functioning bistable switching element 21 is provided which—similar to a ball point pen—retracts the push-off rod 24 with its tip 23 upon pressure, or, at the next pressure application, pushes it forward by means of the prop 22.

If a holding device with a head of this type is pressed against a component, the tip 23 is pushed back into the prop 22 and remains retracted, subject to the bistable switching element 21, so that the component remains directly adhered to the adhesive holding head 22. When the transported component is deposited on a circuit board, a brief pressure is again exerted—as already explained—whereby the tip 23 of the pin 24 is brought forward and pushes the component away from the adhesive surface.

Figure 4:
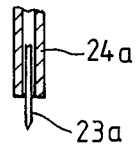
FIG. 4 a possible execution of a holding device to receive components which can be held by tip.

In the explanation of the invention, it was consistently assumed that actual SMD switching elements, for which the invention is particularly suited, are to be picked up, transported, and deposited. The principle of the invention is also applicable for other small parts, e.g. smaller spacers, lamellae, etc. If parts are to be picked up which consist of e.g. paper or some other soft material, one may simply provide a small picker which is guided in a sleeve instead of an adhesive prop, whereby, by means of a bistable switching element, the sleeve is either extended forwards over the tip or retracted in such a manner that the tip can pick up the paper sheet etc. This is clearly shown in FIG. 4, in a section, where a tip 23A, which may correspond to the push-off part in FIG. 3, is guided in a sleeve 24a, which corresponds to the rod 24 and is either pushed forward or retracted, as shown in the figure. With a forward movement, a small element that has been picked up would then be removed.

For the active expert, additional modifications are also possible, whereby attention should always be paid to the fact that a bistable switching element is always switched by a simple pressure on the holding tip proper, whether this be provided with a suction opening or some other potentially adhesive part.

What is claimed is:

1. Holding device consisting of holding head and holding shaft for pick-up, transport, and targeted deposit of small components, preferably for supplying small electrical components, e.g. SMD circuit elements, to circuit boards, whereby the individual components are picked up individually from a container holding several identical components, and individually identified and deposited, e.g. for further treatment on the board, e.g. for establishing contact, said device being characterized in that a bistable shift element is provided which can be triggered by contact pressure of the holding head against a base, e.g. a component, which shift element permits the pick-up of the small component at a first contact pressure and releases or pushes off the picked-up small component at a second contact pressure.

2. Device according to claim 1, characterized in that the bistable shift element is accommodated in the holding head.

3. Device according to claim 1, characterized in that the holding head is executed in two parts in such a manner that a lower retainer element can slide in an upper guide element against the force of a spring in order to activate the bistable shift element.

4. Device according to claim 1, characterized in that the small components to be picked up, transported, or deposited are held against the holding head by means of suction in a manner known per se and that a switching device is provided, which switches the source of negative pressure on or off at each contact pressure of the holding head against the base.

5. Device according to claim 2 characterized in that two contacts, movable relative to one another against spring force, are provided in the holding head, via which contacts or via e.g. an electrical toggle switch coupled between them, the negative pressure of the holding head is switched on or off.

6. Device according to claim 1, characterized in that a mechanically functioning bistable shift element is provided in the holding head, which element extends or retracts a push-off pin with the aid of an adhesive layer provided at the tip of the holding head.

7. Holding device according to claim 1, characterized in that a needle tip extending beyond the tip of the holding head is provided for pick-up of small components with the aid of a needle tip in the holding head, whereby the needle is surrounded by a sleeve which can slide in relation to the needle and rests in bearings, and whereby, depending on the pressure movement, said sleeve can be extended beyond the needle and retracted behind the needle tip in the next movement, being activated in dependence of a mechanically functioning bistable shift element.

8. Device according to claim 2, wherein the holding head is executed in two parts in such a manner that a lower retainer element can slide in an upper guide element against force of a spring in order to activate the bistable shift element.

* * * * *